(12) United States Patent
Ishibashi et al.

(10) Patent No.: US 11,705,315 B2
(45) Date of Patent: Jul. 18, 2023

(54) SPUTTERING APPARATUS AND SPUTTERING METHOD

(71) Applicant: TOKYO ELECTRON LIMITED, Tokyo (JP)

(72) Inventors: Shota Ishibashi, Yamanashi (JP); Hiroyuki Toshima, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/523,783

(22) Filed: Nov. 10, 2021

(65) Prior Publication Data
US 2022/0148863 A1  May 12, 2022

(30) Foreign Application Priority Data
Nov. 11, 2020  (JP) .................. 2020-188284

(51) Int. Cl.
*H01J 37/34* (2006.01)
*C23C 14/54* (2006.01)
*C23C 14/35* (2006.01)

(52) U.S. Cl.
CPC .......... *H01J 37/3476* (2013.01); *C23C 14/35* (2013.01); *C23C 14/54* (2013.01); *H01J 37/3497* (2013.01)

(58) Field of Classification Search
CPC ............... H01J 37/3476; H01J 37/3497; H01J 37/3408; C23C 14/35; C23C 14/54
See application file for complete search history.

(56) References Cited

U.S. PATENT DOCUMENTS

| | | | | | |
|---|---|---|---|---|---|
| 4,414,087 A | * | 11/1983 | Meckel | ............... | H01J 37/3426 204/192.15 |
| 4,983,269 A | * | 1/1991 | Wegmann | ........... | C23C 14/3407 204/298.03 |
| 6,113,754 A | * | 9/2000 | Oh | ...................... | H01J 37/3497 204/192.15 |
| 2002/0100680 A1 | * | 8/2002 | Yamamoto | .......... | H01J 37/3497 204/192.12 |
| 2005/0236266 A1 | * | 10/2005 | Poole | ..................... | C23C 14/54 204/298.03 |
| 2015/0136596 A1 | * | 5/2015 | Nakamura | .......... | H01J 37/3455 204/298.16 |

FOREIGN PATENT DOCUMENTS

| | | | |
|---|---|---|---|
| JP | 10130833 A | * | 5/1998 |
| JP | 2004-534153 A | | 11/2004 |

OTHER PUBLICATIONS

JPH10130833A Translation (Year: 1998).*

* cited by examiner

*Primary Examiner* — Jennifer Wecker
*Assistant Examiner* — Patrick S Ott
(74) *Attorney, Agent, or Firm* — Fenwick & West LLP

(57) ABSTRACT

A sputtering apparatus is provided. The sputtering apparatus comprises a vacuum chamber in which a substrate is located; a target having one surface facing an inner surface of the vacuum chamber; a gas supplier configured to supply a gas for generating plasma in the vacuum chamber; a power supplier configured to supply a power to the target to generate the plasma, sputter the target, and form a film on the substrate; and an abnormality detector configured to detect abnormality caused by a temperature of the target.

10 Claims, 5 Drawing Sheets

SPUTTERING APPARATUS AND SPUTTERING METHOD

CROSS-REFERENCE TO RELATED APPLICATIONS

This application claims priority to Japanese Patent Application No. 2020-188284 filed on Nov. 11, 2020, the entire contents of which are incorporated herein by reference.

TECHNICAL FIELD

The present disclosure relates to a sputtering apparatus and a sputtering method.

BACKGROUND

In a sputtering apparatus used in a semiconductor device manufacturing process, a target made of a film forming material is disposed in a vacuum chamber, and an electric field is generated on a bottom surface side of the target to generate plasma. Such a sputtering apparatus is configured to sputter the target using ions in the plasma.

Japanese Patent Application Publication No. 2004-534153 discloses that when a target is sputtered, a small movable magnet is disposed behind the target to move an erosion area generated by the sputtering, so that local excessive heating or melting of the target can be prevented.

SUMMARY

The present disclosure provides a technique capable of preventing abnormal film formation in a sputtering apparatus.

One aspect of the present disclosure provides sputtering apparatus comprising:
 a vacuum chamber in which a substrate is located;
 a target having one surface facing an inner surface of the vacuum chamber;
 a gas supplier configured to supply a gas for generating plasma in the vacuum chamber;
 a power supplier configured to supply a power to the target to generate the plasma, sputter the target, and form a film on the substrate; and
 an abnormality detector configured to detect abnormality caused by a temperature of the target.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
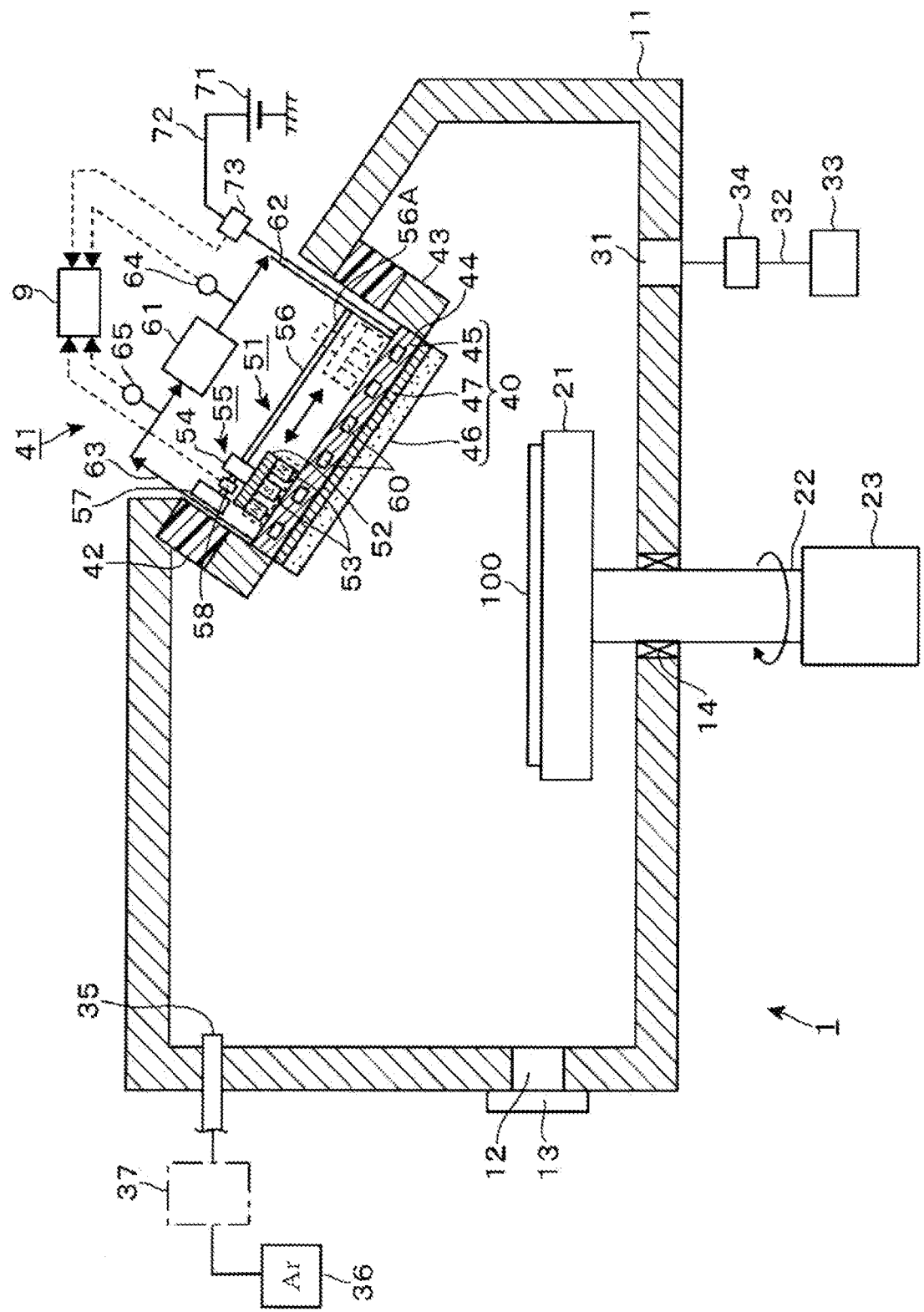
FIG. 1 is a vertical cross-sectional view of a magnetron sputtering apparatus of a present disclosure.

A magnetron sputtering apparatus 1 that is a sputtering apparatus according to an embodiment of the present disclosure will be described with reference to the drawings. FIG. 1 is a longitudinal side view of the magnetron sputtering apparatus 1. In FIG. 1, a reference numeral 11 denotes a vacuum chamber that is made of, e.g., aluminum and is grounded. In FIG. 1, a reference numeral 12 denotes a transfer port for a semiconductor wafer (hereinafter, referred to as "wafer") 100 as a substrate. The transfer port 12 is opened on a sidewall of the vacuum chamber 11. The transfer port 12 is opened and closed by an opening/closing mechanism 13.

A circular stage 21 that is a substrate support is disposed in a vacuum chamber 11, and a wafer 100 is placed thereon horizontally. One end of a shaft portion 22 extending in a vertical direction is connected to a central portion of a back surface of the stage 21. The other end of the shaft portion 22 extends to the outside of the vacuum chamber 11 via a bearing 14 disposed at a bottom portion of the vacuum chamber 11, and is connected to a rotation mechanism 23. The stage 21 is configured to be rotatable about a vertical axis via the shaft portion 22 by the rotation mechanism 23.

A heater (not shown) is disposed in the stage 21 to heat the wafer 100 to a predetermined temperature during film formation. Further, the stage 21 is provided with a protruding pin (not shown) for transferring the wafer 100 between the stage 21 and an external transfer mechanism (not shown) of the vacuum chamber 11.

An exhaust port 31 is opened at a bottom portion of the vacuum chamber 11. One end of an exhaust line 32 is connected to the exhaust port 31, and the other end of the exhaust line 32 is connected to an exhaust pump 33. In FIG. 1, a reference numeral 34 denotes an exhaust amount adjusting mechanism disposed in the exhaust line 32. A gas nozzle 35 that is a gas supplier for plasma generation is disposed at an upper portion of a sidewall of the vacuum chamber 11, and the gas nozzle 35 is connected to a gas supply source 36 in which an inert gas such as Ar or the like is stored. A reference numeral 37 in FIG. 1 denotes a flow rate adjusting unit including a mass flow controller, and controls the amount of Ar gas supplied from the gas supply source 36 to the gas nozzle 35.

A rectangular opening 41 is formed at a ceiling of the vacuum chamber 11, and an insulating member 42 is disposed along an edge of the opening 41 on the inner side of the vacuum chamber 11. A holding portion 43 is disposed along the insulating member 42, and a target electrode 40 having a rectangular plate shape in plan view is disposed on an inner peripheral side of the holding portion 43 to close the opening 41. The target electrode 40 is disposed obliquely with respect to the wafer 100 such that a long side thereof descends from an inner side toward an outer side of the wafer 100.

The target electrode 40 includes a target 46 forming a film forming material, a channel forming portion 45, and an adhesive layer 47. The target 46 faces an inner surface of the vacuum chamber 11. The channel forming portion 45 faces the outside of the vacuum chamber 11. The targets 46 and the channel forming portion 45 are adhered to each other via the adhesive layer 47. The target 46 is made of a material, e.g., titanium (Ti), tungsten (W), tantalum (Ta), or the like. The adhesive layer 47 is made of, e.g., indium. The channel forming portion 45 has therein a coolant channel 60 formed in, e.g., a curving and winding (serpentine) shape from one end toward the other end, and is formed by bonding a thick plate having a groove for forming the channel 60 to another copper plate so that the upper side of the groove is closed.

A cooling water supply line 62 that is a coolant supply path for supplying a coolant, specifically, e.g., cooling water, whose temperature has been controlled by a chiller 61 to the channel 60 is connected to one end of the channel 60. Further, a cooling water discharge line 63 that is a coolant discharge path for returning the cooling water flowing through the channel 60 to the chiller 61 is connected to the other end of the channel 60. Accordingly, a circulation path in which the cooling water flows from one end of the channel 60 and returns to the chiller 61 while being discharged from the other end of the channel 60 is formed. The temperature of the cooling water is adjusted to a predetermined temperature whenever it returns to the chiller 61.

Further, the cooling water supply line 62 is provided with a first temperature detector 64 for detecting a temperature of the cooling water supplied from the chiller 61 to the channel 60. Further, the cooling water discharge line 63 is provided with a second temperature detector 65 for detecting a temperature of the cooling water discharged from the channel 60 and returned to the chiller 61. The functions of the first temperature detector 64 and the second temperature detector 65 will be described in detail later.

A power supplier 71 is connected to the channel forming portion 45. The power supplier 71 is controlled to supply a constant power to the target electrode 40, and generates an electric field in the vacuum chamber 11. A conductive path 72 that connects the power supplier 71 and the channel forming portion 45 is provided with a current detector 73 that is a parameter detector for detecting a value of a current supplied to the target electrode 40. The function of the current detector 73 will also be described in detail later. In this example, a negative DC voltage is applied to the target electrode 40 by the power supplier 71. However, an AC voltage may be applied instead of the DC voltage.

Further, a magnet array 51 is disposed on a back surface side of the target electrode 40 when viewed from the wafer 100. The magnet array 51 includes a rectangular support plate 52 disposed in parallel to the target 46, and a plurality of magnets 53 constituting a magnetic circuit. The magnet 53 extends from a bottom surface of the support plate 52 in a thickness direction of the support plate 52, and a lower end thereof is adjacent to the channel forming portion 45.

As shown in FIG. 1, a bracket 54 is disposed on the support plate 52 and is connected to a moving mechanism 55. The moving mechanism 55 includes, e.g., a ball screw 56 having a screw shaft 56A extending in a longitudinal direction of the target electrode 40, and a motor 57 that is a rotation mechanism for rotating the screw shaft 56A around the axis. The ball screw 56 is screwed into the bracket 54. As the motor 57 rotates in forward and reverse directions, the magnet array 51 reciprocates along an upper surface of the target electrode 40 between one end side (upper end side) and the other end side (lower end side) of the target 46. Accordingly, it is possible to control the distribution of the amount of sputtering on the surface of the target 46 and prevent local sputtering of the target 46.

The rotation speed of the motor 57 is changed by the amount of current supplied from a power supplier (not shown). When the magnet array 51 repeatedly moves on a reciprocating movement path, the operation of the motor 57 is controlled such that the moving speed becomes constant at the same position on the reciprocating movement path. In other words, when viewed from a certain position on the reciprocating movement path, the magnet array 51 passes through the corresponding position at a constant speed even in the case of processing another wafer 100 and even at different timings during processing of one wafer 100. For example, the operation of the motor 57 is controlled such that the speed of the magnet array 51 becomes constant at positions other than both ends where acceleration/deceleration is required on the reciprocating movement path. The motor 57 is connected to the ball screw 56 through a torque detector 58 that is a load detector, and the torque of the motor 57 at the time of rotating the screw shaft 56A can be detected.

Next, the processing of the wafer 100 in the above-described magnetron sputtering apparatus 1 will be described. First, the transfer port 12 of the vacuum chamber 11 is opened, and the wafer 100 is delivered to the stage 21 by cooperation of an external transfer mechanism (not shown) and an upthrust pin (not shown). Then, the transfer port 12 is closed, and Ar gas is supplied into the vacuum chamber 11. Further, an exhaust amount is controlled by the exhaust adjusting mechanism 34, so that a pressure in the vacuum chamber 11 is set to a vacuum atmosphere of a desired pressure. The cooling water circulates through the channel 60 of the target 46, so that a temperature of the target 46 is adjusted.

Then, the stage 21 rotates around the vertical axis, and the magnet array 51 reciprocates on the target 46 by the moving mechanism 55. Then, a negative DC voltage is applied from the power supplier 71 to the target electrode 40, so that an electric field is generated around the target electrode 40. Electrons accelerated by the electric field thus generated collide with the Ar gas, so that the Ar gas is ionized. New electrons are generated by the ionization of Ar gas. On the other hand, the magnet 53 generates a magnetic field along the surface of the target 46 where the magnet 53 is located.

Then, the electrons are accelerated and drifted by the electric field near the target 46 and the magnetic field. Then, the electrons having sufficient energy due to the acceleration further collide with the Ar gas, so that the Ar gas is ionized to generate plasma, and the target 46 is sputtered by Ar ions in the plasma. Further, secondary electrons generated by the sputtering are captured by the horizontal magnetic field and contribute to ionization again. Accordingly, the electron density is increased and the density of the plasma is increased.

The sputtered particles of the target 46 are adhered to the wafer 100, thereby forming a film on the wafer 100. When a predetermined time elapses after the power supplier 71 is turned on, the power supplier 71 is turned off to stop the plasma generation and stop the Ar gas supply. Further, the wafer 100 is unloaded from the vacuum chamber 11 in a reverse sequence of the loading operation. Then, subsequent wafers 100 are sequentially transferred to the magnetron sputtering apparatus 1, and subjected to the same processing as the above-described processing.

In such a sputtering apparatus, it is required to increase a throughput. Therefore, it is considered to relatively increase the power supplied to the target electrode 40 to promote the ionization of Ar ions so that the film forming rate (the amount of film formation per unit time) becomes relatively high. Specifically, for example, it is considered to supply the power to the target 46 such that the area of the target 46 becomes 50 W/cm2 or more.

However, if the target 46 is made of the above-described material having a relatively low thermal conductivity, e.g., Ti, W, Ta, or the like, the heat generated by supplying the high power tends to stay in the target 46. In other words, the heat exchange between the cooling water flowing through the channel 60 of the target 46 and the target 46 is not sufficiently performed, so that the temperature of the target 46 becomes relatively high. When the temperature of the target 46 increases, the target 46 may melt and fall onto the wafer 100, or a void may be formed in the target 46 due to the change in the size of particles forming the target 46. It is known from experience that when sputtering is performed in a state where a void is formed, particles tend to be mixed in the film formed on the wafer 100.

Each of the first temperature detector 64, the second temperature detector 65, the current detector 73, and the torque detector 58 is provided to indirectly detect abnormality (melting, change in the size of a constituent particle) caused by the temperature of the target 46 and prevent abnormal processing of the wafer 100.

Figure 2:
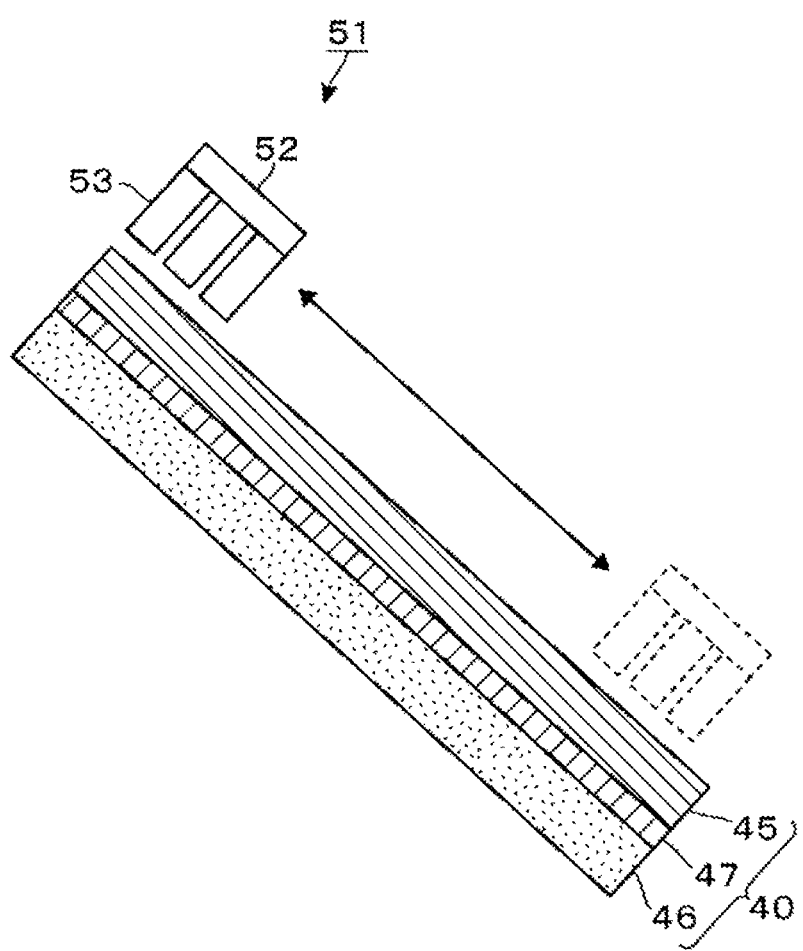
FIG. 2 schematically showing a target electrode in a normal state.
Figure 3:
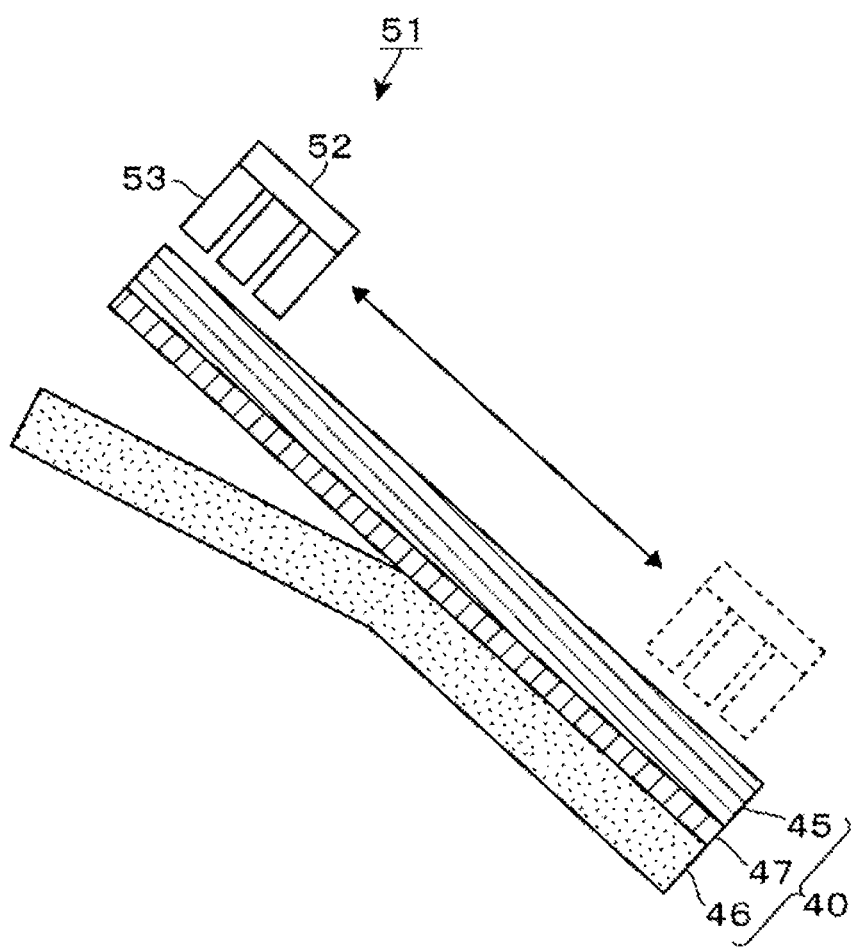
FIG. 3 schematically shows a target electrode in which a target is peeled off.

Among the above-described detectors, the first temperature detector 64, the second temperature detector 65, and the torque detector 58 detect abnormality when the target 46 is peeled off from the channel forming portion 45 due to the high temperature of the target 46. The peeling off of the target 46 will be described with reference to FIGS. 2 and 3. FIGS. 2 and 3 illustrate a target electrode 40 in a normal state in which the target 46 is not peeled off, and a target electrode 40 in a state in which the target 46 is peeled off, respectively. When the target 46 reaches a high temperature, a part of the adhesive layer 47 is melted. Then, a portion of the target 46 where the adhesive layer 47 is melted is bent due to the weight of the target 46 and separated from the channel forming portion 45.

In the target electrode 40 in the normal state shown in FIG. 2, the entire back surface of the target 46 is in contact with the channel forming portion 45 via the adhesive layer 47, and the entire back surface is cooled by the cooling water. On the other hand, in the target electrode 40 in which the target 46 is peeled off as shown in FIG. 3, the contact area between the channel forming portion 45 and the target 46 is smaller than that in the normal state due to the peeling off. Therefore, it is not possible to cool the entire back surface of the target 46, and the amount of heat removed from the target 46 by the cooling water is reduced. Accordingly, the temperature of the cooling water flowing through the cooling water discharge line 63 becomes relatively low.

Therefore, the first temperature detector 64 detects the temperature of the cooling water before the heat of the target 46 in the cooling water supply line 62 is removed, and the second temperature detector 65 detects the temperature of the cooling water whose temperature has increased by removing the heat of the target 46 in the cooling water discharge line 63. More specifically, the difference between a second temperature detection value detected by the second temperature detector 65 and a first temperature detection value detected by the first temperature detector 64 is acquired. As described above, the difference thus calculated changes when the target 46 is peeled off and the amount of removed heat changes. In other words, it is possible to detect the peeling off caused by the high temperature of the target 46 based on the difference, and also possible to detect whether or not the melting of the target 46 and the abnormal particle size, which are considered to be caused by the peeling off, have occurred.

If the variation in the temperature of the cooling water supplied from the chiller 61 to the cooling water supply line 62 is relatively small, the abnormality can be detected using only the detection value obtained by the second temperature detector 65 without using the first temperature detector 64. In other words, the first temperature detector 64 for detecting abnormality with higher accuracy may not be provided.

Next, the function of the torque detector 58 will be described in detail. According to Lenz's law, when a magnet is close to a metal, lines of magnetic force are generated around the metal, and the magnet moves against the magnetic field generated by the lines of magnetic force. Therefore, when the target 46 is peeled off as described above, the peeled-off portion is separated from the magnet array 51 and thus is less likely to be affected by the action of the magnet 53. Accordingly, when the magnet array 51 passes the vicinity of the peeled-off portion, the peeled-off portion is less involved in the formation of the magnetic field, and the magnetic field is generated mainly by the channel forming portion 45 that is a copper plate. As the metal that generates the magnetic field becomes smaller (thinner), the action of the magnetic field is reduced.

As described above, the magnet array 51 is controlled to pass through each position on the reciprocating movement path at a predetermined speed. Thus, when the target 46 is peeled off, the torque of the motor 57 acquired when the magnet array 51 passes the vicinity of the peeled-off portion becomes smaller than the torque acquired before the peeling off occurs. Accordingly, as in the case of using the detection values of the first temperature detector 64 and the second temperature detector 65, it is possible to detect the peeling off of the target 46, and further to detect whether or not the melting of the target 46 and the abnormal particle size have occurred using the detection value of the torque detector 58.

Next, the function of the current detector 73 will be described. Although the power supplier 71 supplies a constant power to the target 46 as described above, a relatively high current supplied to the target 46 at that time is correlated with the occurrence of melting of the target 46. It is considered that this is because when the target 46 is melted, the amount of secondary electrons (electrons emitted by the sputtering of the target 46) from the target 46 increases. Hence, whether or not the abnormality has occurred due to the melting of the target 46 can be detected from the detection result of the current detector 73.

The detection values of the first temperature detector 64, the second temperature detector 65, the current detector 73, and the torque detector 58 are displayed on, e.g., a display unit such as a display, and an operator can detect whether or not the abnormality caused by the temperature of the target 46 has occurred from the display of the detection values. The operator can prevent abnormal processing of the wafer 100 by performing operations such as stopping the operation of the apparatus or stopping the loading of the wafer 100, if necessary.

Next, an example in which detection signals corresponding to the detection values of the first temperature detector 64, the second temperature detector 65, the current detector 73, and the torque detector 58 are outputted to the controller 9 of the magnetron sputtering apparatus 1 shown in FIG. 1 and abnormality caused by the temperature of the target 46 is detected by the controller 9 will be described.

Figure 4:
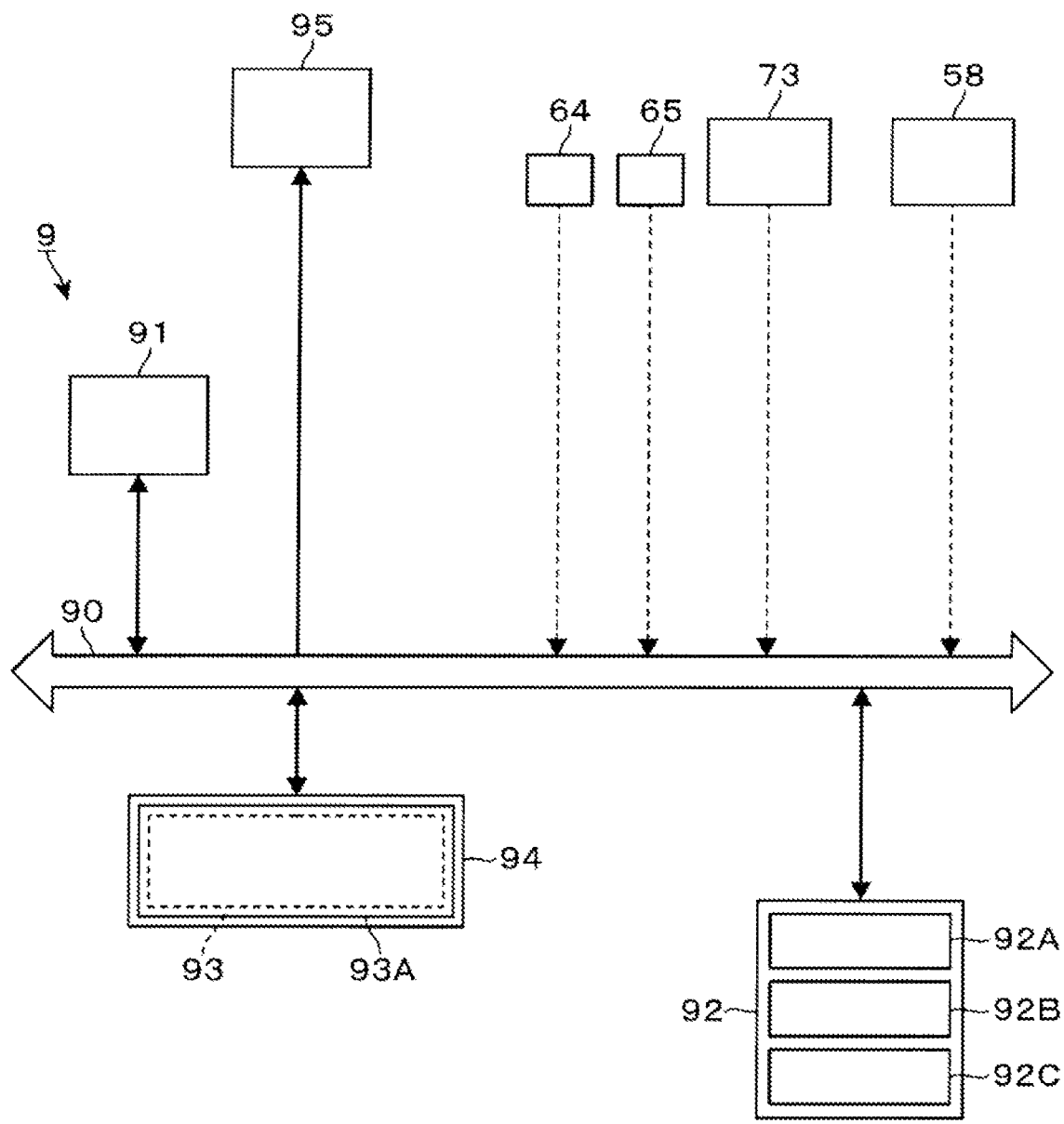
FIG. 4 is a configuration diagram showing a controller of the magnetron sputtering apparatus.

FIG. 4 is a block diagram showing the controller 9 that is a computer. The controller 9 corresponding to first to third detection mechanisms includes a CPU 91, a memory 92, and a program 93. In FIG. 4, a reference numeral 90 denotes a bus that is connected to the CPU 91, the memory 92, a storage 94 storing the program 93, the first temperature detector 64, the second temperature detector 65, the current detector 73, and the torque detector 58. The control signal is transmitted from the controller 9 to the respective units of the magnetron sputtering apparatus 1 by the program 93. The program 93 includes instructions so as to control the operations such as the movement of the magnet array 51, the rotation of the stage 21, the supply of Ar gas, the on/off of the power supplier 71, and the like and perform the film formation on the wafer 100 using the control signal. Further, the program 93 detects the abnormality caused by the temperature of the target 46. In other words, the program 93 includes the first to third detection mechanisms. The program 93 is stored in the storage 94 while being stored in a storage medium 93A, and is installed in the controller 9. The storage medium 93A is, e.g., a compact disc, a hard disk, a magneto-optical (MO) disk, a memory card, or a DVD.

The memory 92 includes a temperature data storage 92A in which the values detected by the first and second temperature detectors 64 and 65 are stored, a current data storage 92B in which the value detected by the current detector 73 is stored, and a torque data storage 92C in which the value detected by the torque detector 58 is stored. The current data storage 92B and the torque data storage 92C correspond to a first storage and a second storage, respectively. As will be described later, the current detector 73 and the torque detector 58 detect abnormality using a detection value obtained at a certain timing and a detection value obtained at another timing earlier than the certain timing. Therefore, at least the current data storage 92B and the torque data storage 92C store multiple detection values obtained at different timings.

An alarm output unit 95 is connected to the bus 90. The control signal is outputted such that the alarm output unit 95 operates depending on an abnormality determination result to be described later. Specifically, an alarm is outputted using voice or screen display to notify the operator that abnormality has occurred.

Hereinafter, an example of an abnormality detection method using the respective detectors will be described. First, the abnormality detection using the first and second temperature detectors 64 and 65 will be described. As described above, the controller 9 detects the detection signals outputted from first temperature detector 64 and the second temperature detector 65 at an arbitrary timing during the period in which the power is supplied from the power supplier 71 to process the wafer 100 and plasma is generated. Then, a first temperature detection value T1 obtained from the first temperature detector 64 and a second temperature detection value T2 obtained from the second temperature detector 65 are stored in the memory 92, and the difference therebetween (T2−T1) is calculated. When the target 46 is peeled off, the second temperature detection value T2 of the cooling water in the discharge line becomes relatively low as described above, so that the difference (T2−T1) becomes a relatively small value. The controller 9 compares the difference (T2−T1) with a preset threshold value. When the difference is higher than the threshold value, it is determined to be normal. When the difference is lower than the threshold value, it is determined that abnormality has occurred.

Next, the abnormality detection using the current detector 73 will be described. As described above, when the target 46 is melted by heat, the current supplied to the target electrode 40 increases. However, even if the abnormality has not occurred, the current supplied to the target electrode 40 tends to be increased when the magnetron sputtering apparatus 1 continues to operate and the target 46 is consumed. Therefore, the increase in the current due to the melting of the target 46 is detected so that it can be distinguished from the increase in the current due to consumption of the target 46.

Figure 5:
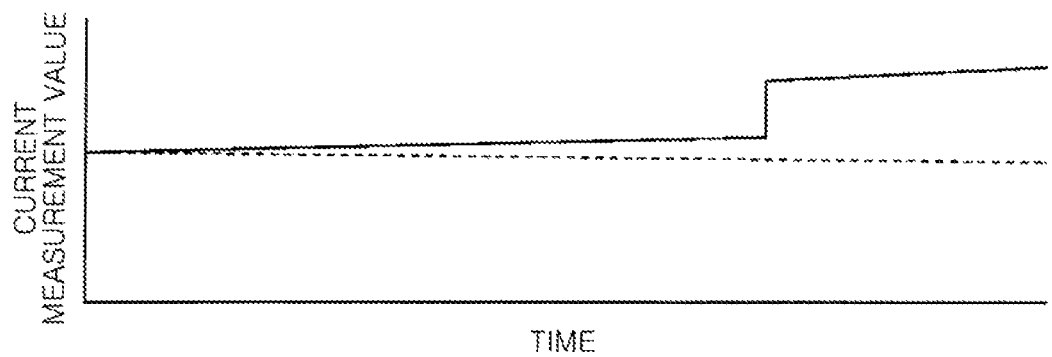
FIG. 5 is a time chart explaining detection of abnormality based on a current detection value.

For better understanding of the description, the graph shown in FIG. 5 schematically illustrates temporal changes of the current in the case where the current detector 73 detects the current whenever the wafer 100 is processed by the magnetron sputtering apparatus 1. It is assumed that the wafer 100 is loaded into the magnetron sputtering apparatus 1 and processed at substantially regular intervals. Whenever the processing is performed, the target 46 is gradually consumed, and the detected current value is gradually increased as the number of detection is increased. As the processing is repeated, the heat is stored in the target 46, and the target 46 is melted by the temperature increase. When the melting occurs, the detected current value increases abruptly.

Therefore, for example, the controller 9 acquires the current value as a parameter using the current detector 73 at an arbitrary timing after the start of the processing on the wafer 100 (referred to as "first wafer 100") and stores it in the memory 92. Then, the controller 9 acquires the current value using the current detector 73 at the same timing in the case of processing a next wafer 100 (referred to as "second wafer 100") loaded into the apparatus and stores it in the memory 92. Then, the difference between the current value obtained at the time of processing the second wafer 100 and the current value obtained at the time of processing the first wafer 100 is calculated. The controller 9 compares the difference with a preset threshold value. When the difference is smaller than the threshold value, it is determined to be normal. When the difference is greater than or equal to the threshold value, it is determined that abnormality has occurred. Since the current value also changes due to the consumption of the target 46 as described above, the threshold value is set to a relatively large value to deal with an abrupt increase caused by the melting of the target 46.

The current values may be acquired whenever the wafer 100 is processed to obtain the difference therebetween, and the difference may be compared with the threshold value as described above. Alternatively, the current values may be acquired whenever the processing is performed multiple times to obtain the difference therebetween, and the difference may be compared with the threshold value. In other words, the first wafer 100 and the second wafer 100 may be or may not be consecutively loaded into the apparatus. For example, the difference between the average value of several current values acquired during one period and the average value of several current values acquired during another period later than that may be calculated and compared with the threshold value. The acquired detection value may be set in an arbitrary manner.

Next, the abnormality detection using the torque detector 58 will be described. As described above, the detected torque is reduced due to the peeling off of the target 46. However, even if the abnormality has not occurred, as the magnetron sputtering apparatus 1 continues to operate and the target 46 is consumed, the action of the magnetic field generated by the target 46 is weakened and the torque tends to be gradually decreased. Therefore, the decrease in the torque due to the peeling off of the target 46 is detected so that it can be distinguished from the change in the torque due to the consumption of the target 46.

Figure 6:
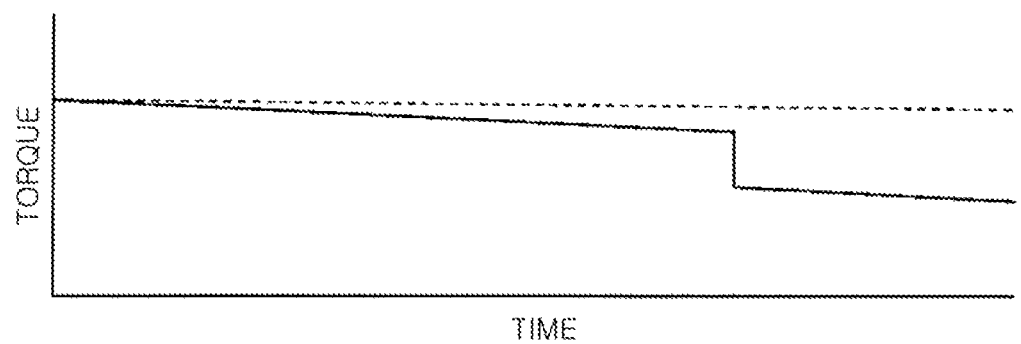
FIG. 6 is a time chart explaining detection of abnormality based on a torque detection value.

For better understanding of the description, the graph of FIG. 6 schematically illustrates temporal changes of the torque in the case where the torque detector 58 detects the torque whenever the wafer 100 is processed by the magnetron sputtering apparatus 1. In this case as well, it is assumed that the wafer 100 is loaded into the magnetron sputtering apparatus 1 and processed at substantially regular intervals. Whenever the processing is performed, the target 46 is gradually consumed, and the detected torque is gradually decreased as the number of detection is increased. As the processing is repeated, the heat is stored in the target 46, and the target 46 is melted by the temperature increase. When the melting occurs, the torque decreases abruptly.

Therefore, for example, the controller 9 acquires the torque detection value using the torque detector 58 at an arbitrary timing after the start of the processing of the wafer 100 (referred to as "first wafer 100") and stores it in the memory 92. Then, the controller 9 acquires the torque detection value using the torque detector 58 at the same timing in the case of processing a next wafer 100 (referred to as "second wafer 100") loaded into the apparatus and stores it in the memory 92. Then, the difference between the detection value at the time of processing the first wafer 100 and the detection value at the time of processing the second wafer 100 is calculated. The controller 9 compares the difference with a preset threshold value. When the difference is smaller than the threshold value, it is determined to be normal. When the difference is greater than or equal to the threshold value, it is determined that abnormality has occurred. Since the torque also changes due to the consumption of the target 46 as described above, the threshold value is set to a relatively large value to deal with an abrupt decrease caused by the peeling off of the target 46.

As in the case of detecting the abnormality using the current value, it is not necessary to acquire the torque for calculating the difference to be compared with the threshold value for each processing, and the difference between the average values obtained during different periods may be compared with the threshold value. The detection value of the torque may be set in an arbitrary manner. Although the example of acquiring the detection values for each wafer has been described, it is also possible to acquire the detection values at different timings during the processing of one wafer 100 and compare the difference therebetween with the threshold value.

When the target 46 is peeled off, the torque acquired when the magnet array 51 passes the vicinity the peeled-off portion becomes lower than that in a normal state. However, the torque acquired when the magnet array 51 passes a position relatively distant from the peeled-off portion may be substantially the same as that in the normal state. Therefore, in order to improve the accuracy of abnormality detection, the torques are acquired when the magnet array 51 passes multiple positions on the reciprocating movement path. Then, the abnormality detection may be performed for each position where the torque is acquired using the detection value at the time of processing the first wafer 100 and the detection value at the time of processing the second wafer 100 as described above.

When one or more of the detection results of the first and second temperature detectors 64 and 65, the current detector 73, and the torque detector 58 are determined to be abnormal, the program 93 determines that abnormality has occurred due to the temperature, and outputs an alarm. The operation of the apparatus may be stopped when the alarm is outputted.

As described above, in accordance with the magnetron sputtering apparatus 1, the abnormality caused by the temperature of the target 46 can be detected using the first temperature detector 64, the second temperature detector 65, the current detector 73, and the torque detector 58 constituting the abnormality detector. Accordingly, it is possible to prevent abnormal processing of the wafer 100. Although the case in which the abnormality caused by the temperature of the target 46 includes the melting and the particle size change and whether or not the target 46 is peeled off is detected to detect such abnormalities has been described, the present disclosure may be used to detect the peeling off of the target 46 as the abnormality caused by the temperature.

In the case of detecting abnormality using the current detector 73, when the current detected at an arbitrary timing is relatively high, it may be determined that abnormality has occurred. Similarly, when the torque detected at an arbitrary timing by the torque detector 58 is relatively low, it may be determined that abnormality has occurred. In other words, it is not necessarily that the memory 92 stores the measured values acquired at different timings. Further, an operator may perform the above-described abnormality detection method executed by the controller 9 while looking at the display unit as described above.

Further, the magnetron sputtering apparatus does not necessarily have the configuration in which the magnet array 51 reciprocates linearly. For example, it is possible to use a configuration in which a rotation axis extending in a direction orthogonal to a plane direction of the target 46 is rotated by the motor 57, and the magnet array is rotated about the rotation axis to change an magnetic field on a front surface side (bottom surface side) of the target 46. Even in that case, the torque detector may be provided to measure the torque of the motor 57 or detect the torque of the rotation axis.

The torque as the load of the motor 57 and the current supplied to the motor 57 are correlated with each other. Therefore, the abnormality can be detected by detecting the current instead of the torque.

Further, instead of providing the current detector 73 for detecting a current supplied to the target electrode 40, a voltage detector for detecting a voltage applied to the target electrode 40 may be provided. Since it is controlled such that a constant power is supplied to the target electrode 40, the voltage decreases as the current supplied to the target electrode 40 increases. Therefore, when the target 46 is melted, the current increases, and the voltage decreases in response to the increase in the current. Accordingly, as in the case of detecting the change in the current as described with reference to FIG. 5, the change in the voltage can be detected, and the melting of the target 46 can be detected when the change in the voltage exceeds the threshold value.

Further, the sputtering apparatus of the present disclosure is not limited to the magnetron sputtering apparatus including the magnet array 51. For example, it is possible to use a sputtering apparatus that does not include the magnet array 51 and generates an electric field in a vacuum chamber by the power applied to the target electrode, generates plasma from an inert gas, and sputters the target with ions in the plasma. Even in that case, the abnormality can be detected by the first temperature detector 64, the second temperature detector 65, and the current detector 73.

As described above, the embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A sputtering apparatus comprising:
   a vacuum chamber in which a substrate is located;
   a target having one surface facing an inner surface of the vacuum chamber;
   a coolant channel portion forming a channel of a coolant and disposed on a back surface of the target;
   an adhesive layer adhering the target to the coolant channel portion;
   a gas supplier configured to supply a gas for generating plasma in the vacuum chamber;
   a power supplier configured to supply a power to the target to generate the plasma, sputter the target, and form a film on the substrate;
   an abnormality detector configured to detect whether or not a peeling off of the target from the coolant channel portion has occurred, the peeling off being caused by increases in temperatures of the target and the adhesive layer; and
   a controller configured to calculate a difference value between a first parameter value obtained by the abnormality detector at a first detection time and a second parameter value obtained by the abnormality detector at a second detection time, and to determine whether or not the peeling off has occurred by comparing the difference value with a preset threshold value.

2. The sputtering apparatus of claim 1, wherein the abnormality detector includes a first temperature detector configured to detect a temperature of the coolant in a discharge path connected to the channel.

3. The sputtering apparatus of claim 2, wherein the abnormality detector includes a second temperature detector configured to detect a temperature of the coolant in a supply path connected to the channel.

4. The sputtering apparatus of claim 3, further comprising:
   a first detection mechanism configured to detect whether or not the peeling off has occurred based on a detection value obtained by the first temperature detector and a detection value obtained by the second temperature detector.

5. The sputtering apparatus of claim 1, further comprising:
   a magnet array disposed on the back surface of the target to perform magnetron sputtering; and
   a moving mechanism configured to move the magnet array along the back surface of the target,
   wherein the abnormality detector includes a load detector configured to detect a load of the moving mechanism.

6. The sputtering apparatus of claim 5, further comprising:
   a second storage configured to store parameters for the load; and
   a third detection mechanism configured to detect whether or not the peeling off has occurred based on the parameters for the load acquired at different timings and stored in the second storage.

7. A sputtering method comprising:
   locating a substrate in a vacuum chamber;
   supplying a gas for generating plasma into the vacuum chamber using a gas supplier;
   generating the plasma by supplying a power to a target to form a film on the substrate using the power supplier and sputtering the target having one surface facing an inner surface of the vacuum chamber; and
   detecting a peeling off of the target from a coolant channel portion caused by increases in temperatures of the target and an adhesive layer via which the target and the coolant channel portion are adhered to each other,
   wherein a difference value between a first parameter value obtained by an abnormality detector at a first detection time and a second parameter value obtained by the abnormality detector at a second detection time is calculated, and whether or not the peeling off has occurred is determined by comparing the difference value with a preset threshold value.

8. A sputtering apparatus comprising:
   a vacuum chamber in which a substrate is located;
   a target having one surface facing an inner surface of the vacuum chamber;
   a coolant channel portion forming a channel of a coolant and disposed on a back surface of the target;
   an adhesive layer adhering the target to the coolant channel portion;
   a gas supplier configured to supply a gas for generating plasma in the vacuum chamber;
   a power supplier configured to supply a power to the target to generate the plasma, sputter the target, and form a film on the substrate;
   an abnormality detector configured to detect whether or not a melting of the target has occurred, the melting being caused by increases in temperatures of the target and the adhesive layer; and
   a controller configured to calculate a difference value between a first parameter value obtained by the abnormality detector at a first detection time and a second parameter value obtained by the abnormality detector at a second detection time, and to determine whether or not the melting has occurred by comparing the difference value with a preset threshold value.

9. The sputtering apparatus of claim 8, wherein the abnormality detector includes a parameter detector configured to detect, as parameters, a value of a current supplied to the target by the power supplier or a value of a voltage applied to the target by the power supplier.

10. The sputtering apparatus of claim 9, further comprising:
    a first storage configured to store the parameter; and
    a second detection mechanism configured to detect whether or not the melting has occurred based on the parameters acquired at different timings and stored in the first storage.

* * * * *